(12) United States Patent
Santos et al.

(10) Patent No.: US 8,462,034 B2
(45) Date of Patent: Jun. 11, 2013

(54) SYNCHRONOUS SWITCHING IN HIGH-SPEED DIGITAL-TO-ANALOG CONVERTER USING QUAD SYNCHRONIZING LATCH

(75) Inventors: Bruno M. S. Santos, Alverca do Ribatejo (PT); Antonio I. R. Leal, Sintra (PT); Carlos M. A. Azeredo-Leme, Lisboa (PT)

(73) Assignee: Synopsys, Inc., Mountain View, CA (US)

( * ) Notice: Subject to any disclaimer, the term of this patent is extended or adjusted under 35 U.S.C. 154(b) by 159 days.

(21) Appl. No.: 13/183,370

(22) Filed: Jul. 14, 2011

(65) Prior Publication Data

US 2013/0015993 A1 Jan. 17, 2013

(51) Int. Cl.
*H03M 1/66* (2006.01)
(52) U.S. Cl.
USPC ........... 341/144; 327/157; 327/292; 327/144; 327/177; 327/161; 370/329; 370/338; 370/352; 370/463; 345/204; 345/211; 360/31; 360/75
(58) Field of Classification Search
USPC .................. 341/144–160; 713/300, 400, 503; 327/144–161, 277, 292, 294, 296, 333; 360/31, 360/75; 700/200, 202; 345/204, 211; 370/329, 370/338, 352, 463
See application file for complete search history.

(56) References Cited

U.S. PATENT DOCUMENTS

| | | | | |
|---|---|---|---|---|
| 5,793,437 | A * | 8/1998 | Inamori | 348/559 |
| 6,842,132 | B2 * | 1/2005 | Schafferer | 341/144 |
| 6,924,686 | B2 * | 8/2005 | Kirsch | 327/277 |
| 8,164,375 | B2 * | 4/2012 | LaBerge | 327/291 |
| 8,214,668 | B2 * | 7/2012 | Kajihara | 713/300 |
| 2005/0089061 | A1 * | 4/2005 | Logvinov et al. | 370/463 |

OTHER PUBLICATIONS

Park, S. et al., "A Digital-to-Analog Converter Based on Differential-Quad Switching," IEEE Journal of Solid-State Circuits, Oct. 2002, pp. 1335-1338, vol. 37, No. 10.
Schafferer, B. et al., "A 3V CMOS 400mW 14b 1.4GS/s DAC for Multi-Carrier Applications," ISSCC 2004, Session 20, Digital-to-Analog Converters, IEEE, 10 pages, vol. 20.1.

* cited by examiner

*Primary Examiner* — Lam T Mai
(74) *Attorney, Agent, or Firm* — Fenwick & West LLP

(57) ABSTRACT

A synchronizing circuit compatible with a quad switching scheme in a digital-to-analog converter (DAC) to synchronize turning on or off of switches for steering current to a differential output. The synchronizing circuit receives signals from a decoder and synchronizes control signals to the switches by a clock signal. In one embodiment, the synchronizing circuit includes a predictor circuit and a latch circuit. The latch circuit may include four sets of cross-coupled inverters where a set of cross-coupled inverters are activated at a time. By using the synchronizing circuit in conjunction with the quad switching scheme, linearity of analog output from the DAC can be improved and data dependent noise in the analog output can be removed or reduced.

22 Claims, 5 Drawing Sheets

SYNCHRONOUS SWITCHING IN HIGH-SPEED DIGITAL-TO-ANALOG CONVERTER USING QUAD SYNCHRONIZING LATCH

BACKGROUND OF THE INVENTION

1. Field of the Disclosure

The present disclosure relates to a high-speed digital-to-analog converter and more specifically to a latch for synchronizing control signals for switching switches that steer current to the output of the digital-to-analog converter.

2. Description of the Related Art

High-speed and high-accuracy digital-to-analog converters (DACs) are important building blocks for many signal processing and telecommunication systems. A DAC is a device that converters a digital signal into an analog signal in the form of, for example, current, voltage or electric charge. Due to the ever increasing digital processing power and speed of modern chips, the need for DACs with higher sampling speed is on the rise. For example, 3D high-definition televisions (HDTVs) use DACs with 200 Mega samples per second (MSPS) while telecommunication transmitters use DACs with over 300 MSPS. In addition to the high sampling speed, many of these applications also require very high linearity and high Spurious-Free Dynamic Range (SFDR) in the output analog signal.

Generally DACs use multiple switches to steer current to an output. The switches are operated by digital signals generated by a chain of digital signal processing. As the switches are turned on or off by the digital signals, jitter in the digital signals to the switches may degrade linearity performance and add spurious noises at the analog output. With high-speed DACs, the situation is especially critical since jitter at the digital signals tends to cause more pronounced effect as the frequency increases.

Another important factor in high-speed DACs is data dependent switching of switches. Data dependent switching can be caused partly due to the asymmetry in the beginning transition and ending transition of "on" pulse (e.g., "1" pulse) and "off" pulse (e.g., "0" pulse). Generally, the transition time for turning on the pulse and turning off the pulse are asymmetric. Due to such differences in transition time, data stream including combinations of "on" pulses and "off" pulses generate noise in the analog output of the DACs that is dependent on digital signals provided to the DACs. Although differential switching can partly remove nonlinearities, some data-dependent noise remains even when differential switching is used.

SUMMARY

Embodiments relate to a switching module in a digital-to-analog converter including a switch driver circuit and a synchronizing circuit for aligning waveforms of control signals that operate multiple switches in the switch driver. The synchronizing circuit receives a first digital signal at a first time that indicates activation of one switch of the multiple switches in the switch driver circuit. The synchronizing circuit also receives a second digital signal at a second time subsequent to the first time that indicates the activation of another switch of the multiple switches. Based on the first digital signal and a clock signal, the synchronizing circuit generates a control signal having a plurality of signal elements and representing a synchronized version of the second digital signal. The waveforms of the signal elements are aligned by the clock signal.

In one embodiment, the switch driver circuit includes four switches that are controlled by the control signal according to a quad switching scheme. Two of the four switches connect a current source to a first one of two differential outputs when the two switches are turned on. The remaining two switches connect the current source to a second one of the two differential outputs when the remaining two switches are turned on.

In one embodiment, the synchronizing circuit includes a plurality of transistors turned on or off by the clock signal to align the waveforms of the signal elements of the control signal.

In one embodiment, the synchronizing circuit includes multiple sets of inverters and a combination of logic components. Each set of inverters is coupled between two control lines for carrying part of the control signal. The combination of logic components is coupled to the multiple sets of inverters and sends an activation signal for activating a set of inverters at a time.

In one embodiment, the combination of logic components includes a plurality of latches for receiving the first and second digital signals, a plurality of first gate components and a plurality of second gate components. Each of the plurality of first gate components has an input coupled to an input of a latch and the other input coupled to an output of the latch to determine a change in a corresponding signal element between the first time and the second time. Each of the second gate components has two inputs connected to outputs of the two of the first gate components. Each of the second gate components sends the activation signal to a set of inverters.

In one embodiment, each set of inverters includes a first inverter and a second inverter. The first inverter, when turned on, has its input coupled to a first one of the two control lines and its output coupled to a second one of the two control lines. The second inverter, when turned on, has its input coupled to the second one of the two control lines and its output coupled to the first one of the two control lines.

In one embodiment, the switch driver circuit is coupled between a current source and two differential outputs to selectively couple the current source to one of the two differential outputs based on the control signal.

In one embodiment, the decoder is configured to convert a binary digital data to the first and second digital signals that are thermometer coded.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a synchronizing circuit compatible with a quad switching scheme in a digital-to-analog converter (DAC) to synchronize turning on or off of switches for steering current to a differential output. The synchronizing circuit receives signals from a decoder and synchronizes control signals to the switches by a clock signal. In one embodiment, the synchronizing circuit includes a predictor circuit and a latch circuit. The latch circuit may include four sets of cross-coupled inverters where a set of cross-coupled inverters is activated at a time. By using the synchronizing circuit in conjunction with the quad switching scheme, linearity of analog output from the DAC can be improved and data dependent noise in the analog output can be removed or reduced.

Figure 1:
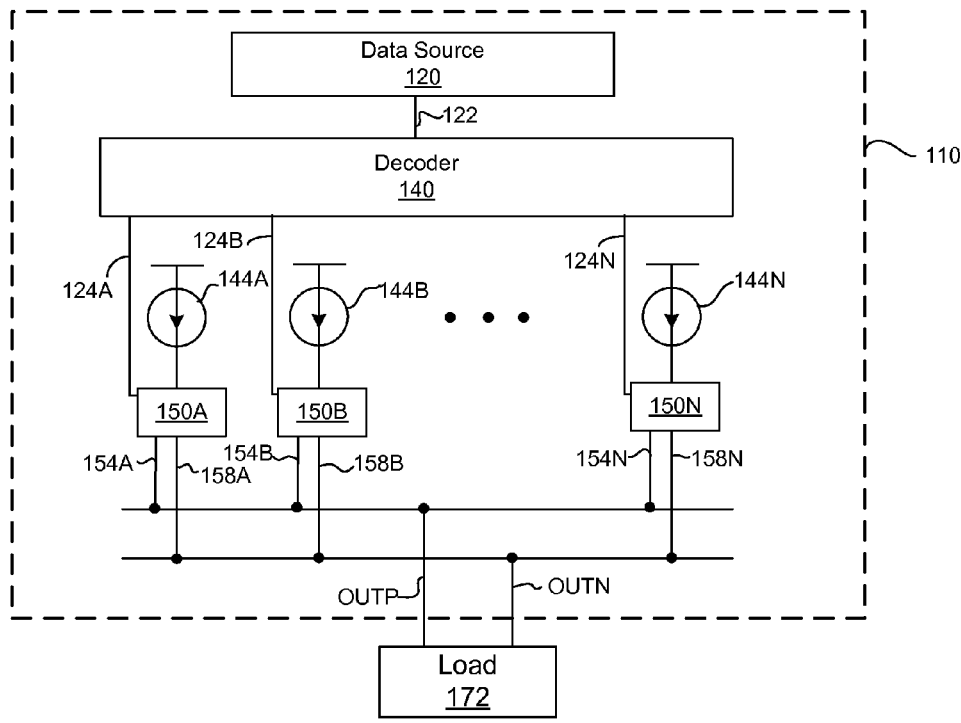
FIG. 1 is a block diagram illustrating a digital-to-analog converter (DAC), according to one embodiment.

FIG. 1 is a block diagram illustrating a DAC 110 according to one embodiment. DAC 110 has differential outputs (OUTP and OUTPN) via which a differential output signal are provided to load 172. The differential output signal is based on, for example, an external signal (not shown) that is processed at data source 120. DAC 110 may include, among other components, data source 120, a decoder 140, a plurality of current sources 144A through 144N (hereinafter collectively referred to as "current sources 144" or individually as "current source 144"), and a plurality of switching modules 150A through 150N (hereinafter collectively referred to as "switching module 150" or individually as "switching module 150"). DAC 110 may include other components not illustrated in FIG. 1 such as a power source and components for reducing electromagnetic interference (EMI).

Data source 120 is hardware, firmware, software or a combination thereof for processing digital signals. Digital source 120 may receive external signals (not shown) and process these signals using digital signal processing (DSP) algorithms to compute a differential voltage level to be output at differential outputs OUTP and OUTN. Digital data 122 may be a binary signal representing the differential voltage level across outputs OUTP and OUTN. In one example, digital data 122 is 8 bit binary signal that can represent 256 distinct values.

Decoder 140 is a binary-to-thermometer decoder circuit that converts binary coded digital data 122 from data source 120 into thermometer coded decoder signals 124A through 124N (hereinafter collectively referred to as "decoder signals 124") using a method well known in the art or to be developed in the future. As described below in detail with reference to FIG. 3A, decoder 140 may output decoder signals 124' to implement a quad switching scheme.

Each of current sources 144A through 144N provides current via each of switching modules 150A through 150N to one of two differential outputs OUTP and OUTN. Current sources 144 may be embodied using any conventional current sources or any current sources to be developed in the future.

Each switch module 150A though 150N connects a corresponding current source 144A though 144N to OUTP via line 154A through 154N or to OUTPN via line 158A through 158N in response to receiving decoder signals 124A through 124N. As different current sources 144 are coupled to differential outputs OUTP or OUTN via switch modules 150, the voltage difference across differential outputs OUTP and OUTN provided to load 172 changes accordingly.

Figure 2:
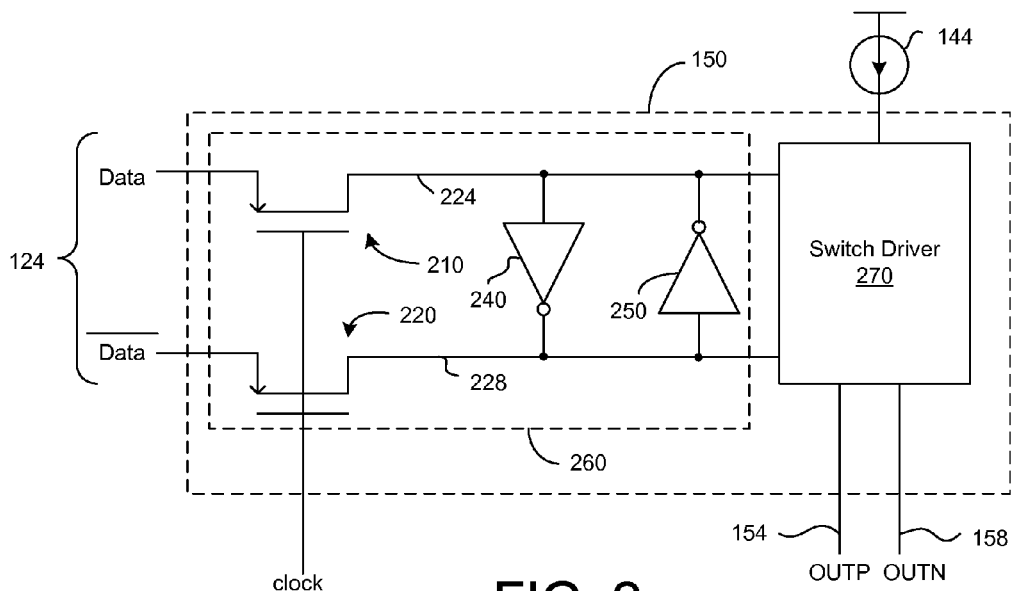
FIG. 2 is a circuit diagram illustrating an example of switching latch in a DAC.

Decoder signals 124A through 124N may not be synchronized and may include jitter. Hence, to remove or reduce jitter, each of the switching modules 150A through 150N may be synchronized based on a clock signal. FIG. 2 is an example of switching module 150 for synchronizing switching of current source 144. Switching module 150 receives decoder signal 124 in the form of data and $\overline{data}$(complement of data), and couples current source 144 to line 154 or line 158. Switching module 150 may include, among other components, a switching latch 260 and a switch driver circuit 270.

Switching latch 260 may include, among other components, two metal-oxide-semiconductor field-effect transistors (MOSFETs) 210, 220, two inverters 240, 250. Switching latch 260 functions to synchronize input to the switch driver circuit 270 based on a clock signal. MOSFETs 210, 220 are connected to switch driver 220 via lines 224 and 228, respectively. MOSFETs 210, 220 are also connected to decoder 140 to receive data and $\overline{data}$, respectively. Outputs from MOSFETs 210, 220 are synchronized by a clock signal (clock) and provided to switch driver circuit 270. Inverters 240, 250 are cross coupled between line 224 and 228 to increase the speed of transitions by implementing positive feedback.

Switch driver circuit 270 includes multiple switches that operate based on the signals received via lines 224 and 228. The multiple switches selectively couple current source 144 to line 154 or 158. Switch driver circuit 270 may be embodied using various circuits well known in the art or to be developed in the future.

Although switch module 150 of FIG. 2 functions effectively as a timing latch that cleans jitter in decoder signal 124, switch module 150 may still suffer from data dependent inaccuracies within the switch driver circuit 250. One way of reducing or removing the data dependent inaccuracies is using a quad switching scheme described, for example, in Sungkyung Park et al., "A Digital-to-Analog Converter Based on Differential-Quad Switching," IEEE Journal of Solid-State Circuits, vol. 38, No. 10 (October 2002), which is incorporated by reference herein in its entirety.

The quad switching scheme uses four switches (and four control signals) to connect a current source to an output. In a clock cycle, one of the four switches is turned on whereas other three switches are turned off. In a subsequent clock cycle, a different switch is turned on while the switch activated in a previous cycle is turned off. The switch to be turned on in a next cycle is one of two switches adjacent to the switch that was turned on in a previous cycle. Even if the current source should remain connected to the same output (OUTP or OUTN) during two adjacent clock cycles, the activated switch is shifted between the two clock cycles. In this way, data dependent noise is reduced or removed.

Figure 3A:
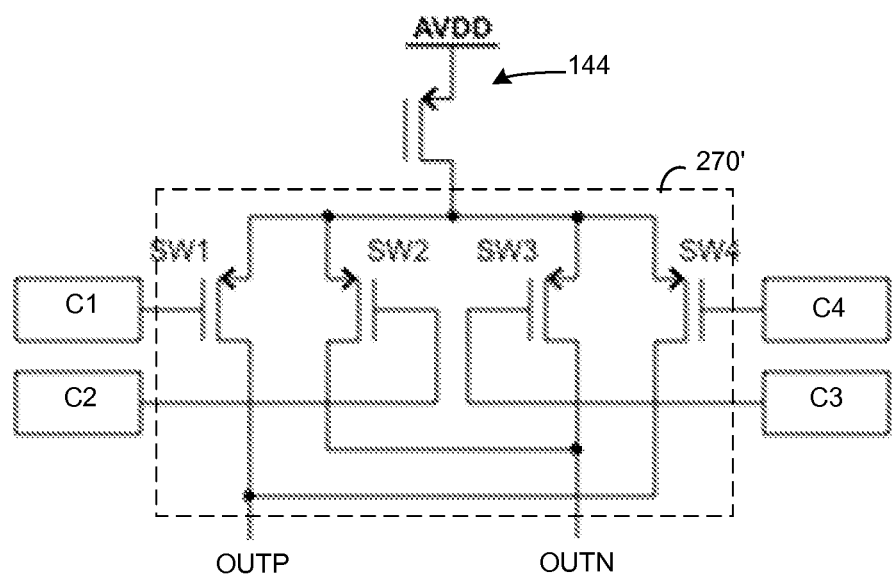
FIG. 3A is a circuit diagram of a switch driver circuit operated by a quad switching scheme, according to one embodiment.

FIG. 3A is a circuit diagram of a switch driver circuit 270' using a quad switching scheme, according to one embodiment. Switch driver circuit 270' includes four switches SW1, SW2, SW3, SW4. Two of the switches SW1 and SW4 are connected between current source 144 (embodied as a PFET 144) and OUTP. The remaining switches SW2 and SW3 are connected between current source 144 and OUTN. Each of the switches SW1 through SW4 are turned on or off based on control signals C1 through C4, respectively. Only one of the control signals C1 through C4 is active in a clock cycle, and the active control signals C1 through C4 shift in every clock cycle. After a control signal activates a switch in a cycle, an adjacent switch is activated in a next clock cycle. For example, if switch SW2 was activated in a clock cycle, switch SW1 or SW3 is activated in a subsequent clock cycle. That is, the active switch becomes SW3 in the subsequent clock cycle if the control signals indicate that current source 144 should remain connected to output OUTN whereas the active switch becomes SW1 if the control signals indicate that current source 144 should be connected to output OUTP. Similarly, if switch SW4 is active in a clock cycle, the active switch in a subsequent cycle should be switch SW3 or SW1.

One way of controlling the switches SW1 through SW4 in switch driver circuit 270' is to feed control signals C1 through C4 directly from decoder 140 without synchronizing control signals C1 through C4. However, such unsynchronized control signals C1 through C4 may cause jitter in the analog signal output of DAC 110. To remove the jitter, it is advantageous to synchronize control signals C1 through C4. However, switching latch 260 of FIG. 2 is incompatible with switch driver circuit 270' because switching latch 260 provides only two synchronized outputs whereas switch driver circuit 270' has four input signals (control signals C1 through C4) that should be synchronized.

Figure 3B:
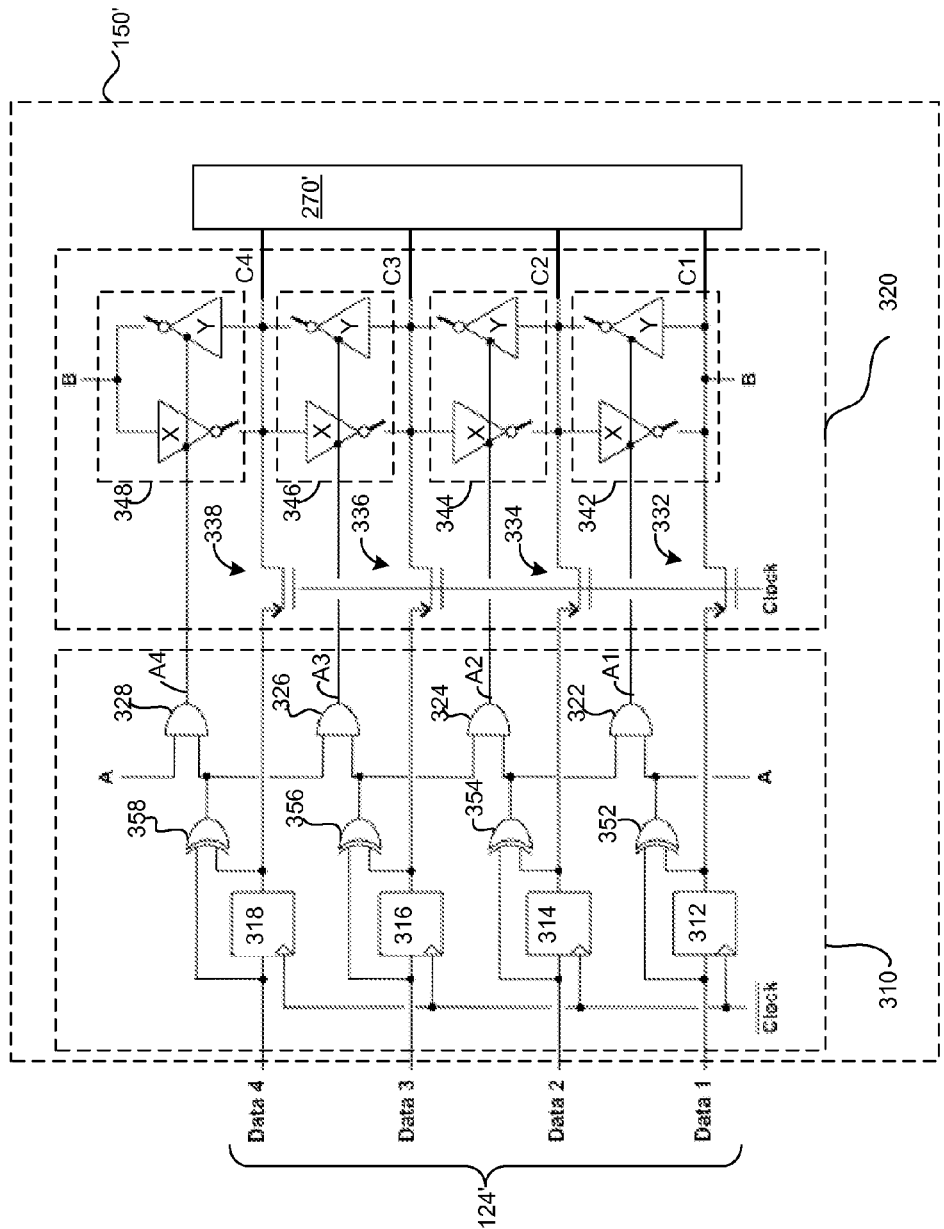
FIG. 3B is a circuit diagram illustrating a switching module according to one embodiment.

FIG. 3B is a circuit diagram illustrating a switching module 150' compatible with switch driver circuit 270' of FIG. 3A, according to one embodiment. Differential latch module 300 aligns waveforms of decoder outputs (data 1 through data 4) using a clock signal (clock and $\overline{\text{clock}}$). Switching module 150' may include, among other components, a predictor module 310 and a cross-coupled latch module 320. Predictor module 310 generates activation signals A1 through A4 to selectively turn on a set of inverters in cross-coupled latch module 320 based on decoder outputs 124' (in the form of data 1 through data 4) at the current clock cycle and at the previous clock cycle.

In one embodiment, predictor module 310 includes four latches 312, 314, 316, 318, four XOR gates 352, 354, 356, 358, and four AND gates 322, 324, 326, 328. Each of latches 312, 314, 316, 318 stores and outputs previous activation states of a corresponding decoder data (data 1 through data 4). Each of the XOR gates 352, 354, 356, 358 has two inputs, one connected to decoder data line (input to a corresponding latch) and the other connected to the output of the corresponding latch to detect decoder data lines that changed activation states between a previous clock cycle and the current clock cycle. The operation of latches 312, 314, 316, 318 is synchronized by an inverted version of the clock signal ($\overline{\text{clock}}$).

Each of the AND gates 322, 324, 326, 328 has two inputs, each input connected to an output of two adjacent XOR gates. That is, the two inputs of AND gate 322 are connected to outputs of XOR gates 352 and 354, the two inputs of AND gate 324 are connected to outputs of XOR gates 354 and 356, the two inputs of AND gate 326 are connected to outputs of XOR gates 356 and 358, and the two inputs of AND gate 328 are connected to outputs of XOR gates 358 and 352 (two nodes "A" in FIG. 3B are connected to each other).

Each of AND gates 322, 324, 326, 328 determines if a set of adjacent XOR gates are turned on, and if so, each of AND gates 322, 324, 326, 328 generates a corresponding activation signal (one of A1 through A4). Only one of the activation signals A1 through A4 is active in a clock cycle.

Cross-coupled latch module 320 may include, among other components, four field-effect transistors (FETs) 332, 334, 336, 338 and four sets of inverters 342, 344, 346, 348. Each of FETs 332, 334, 336, 338 has its gate receiving a clock signal (clock) to synchronize transitioning of the output from a corresponding latch 312, 314, 316, 318. Each set of inverters 342, 344, 346, 348 includes two inverters X and Y that are switchably cross-coupled between two control signal lines. Specifically, inverter set 342 cross-couples control signal lines C1 and C2 when activation signal A1 is active, inverter set 344 cross-couples control signal lines C2 and C3 when activation signal A2 is active, inverter set 346 cross-couples control signal lines C3 and C4 when activation signal A3 is active, and inverter set 348 cross-couples control signal lines C4 and C1 (two nodes "B" in FIG. 3B are connected to each other) when activation signal A4 is active. The sets of inverters 342, 344, 346, 348 increase the transition speed of the control signals transmitted via control signal lines C1 through C4. When an activation signal for an inverter set is inactive, the inverter set is disconnected from the control signal lines.

Figures 4, 5, 6:
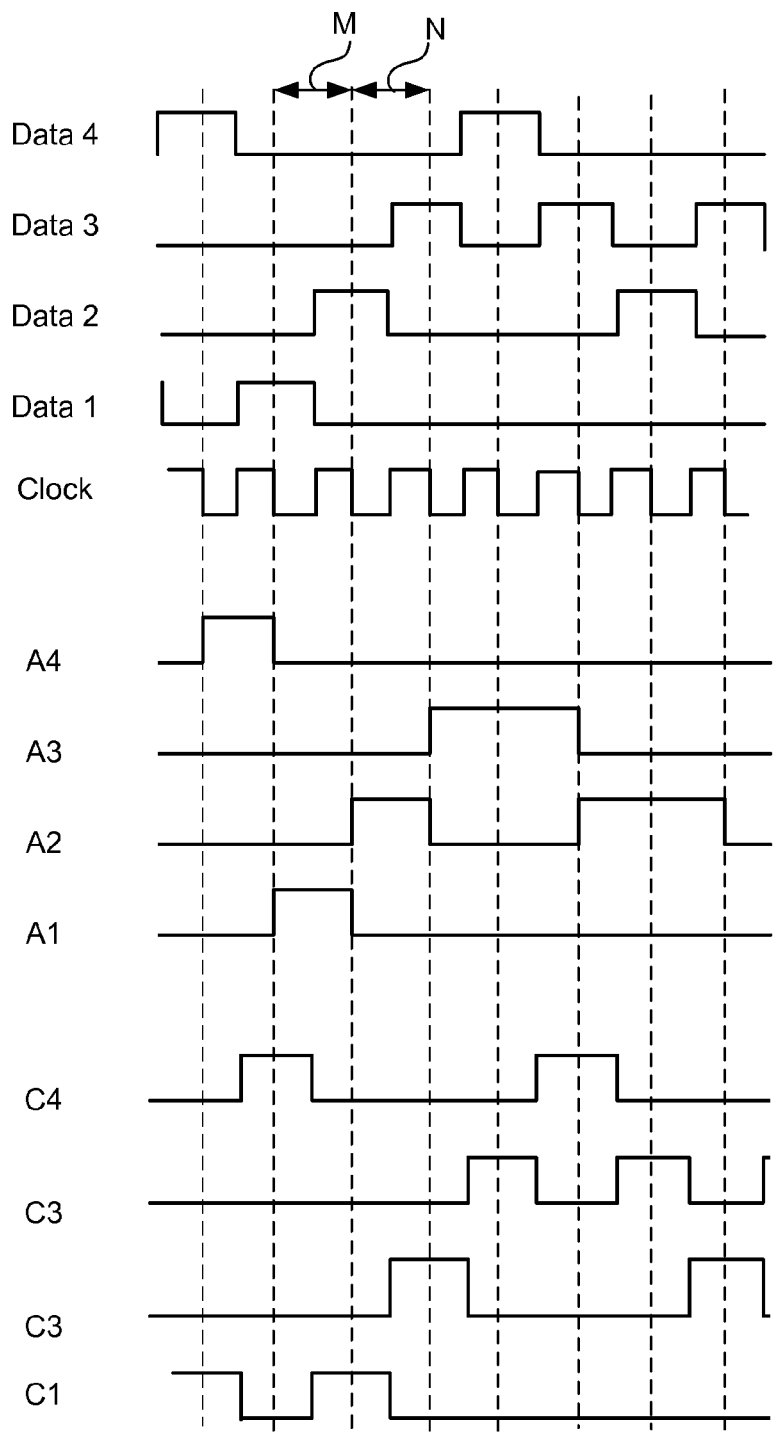
FIG. 4 is a timing diagram illustrating a decoder output and a clock signal, according to one embodiment.
FIG. 5 is a timing diagram illustrating activation signals for turning on inverter sets, according to one embodiment.
FIG. 6 is a timing diagram illustrating control signals for operating switches, according to one embodiment.

FIG. 4 is a timing diagram illustrating decoder output (data 1 through data 4) generated by decoder 140 and a clock signal (clock), according to one embodiment. In the example of FIG. 4, the sequence of active decoder output lines is as follows: data 1, data 4, data 1, data 2, data 3, data 4, data 3, data 2, and data 3. As illustrated in FIG. 4, only a single decoder is active at a time and the decoder output line turning active is adjacent to a decoder output line that was active in a previous clock cycle.

FIG. 5 is a timing diagram illustrating states of activation signals A1 through A4, according to one embodiment. Taking an example of period M where data 1 turns from active to inactive and data 2 turns from inactive to active (data 3 and data 4 remain in inactive state), the output from latch 312 is active (because data 1 was active before the transition) while the input to latch 312 is inactive (because data 1 is inactive after the transition). Two inputs to XOR gate 352 correspond to the input and output of latch 312, respectively. The two inputs to XOR gate 352 have different values, and hence, the output from XOR gate 352 turns active. The output from latch 314 is inactive (because data 2 was inactive before the transition) but the input to latch 314 is active (because data 2 was active before the transition). Two inputs to XOR gate 354 correspond to the input and output of latch 314, respectively. The two inputs to XOR gate 354 have different values, and hence, the output from XOR gate 324 turns active. The outputs from XOR gates 322 and 324 are both active, and hence, activation signal A1 generated by AND gate 322 turns active. Data 3 and data 4 remain unchanged during period M, and hence, the outputs of XOR gates 356 and 358 remain inactive. Accordingly, only the output of AND gate 322 is active while the outputs of AND gates 324, 326 and 328 remain inactive. Therefore, activation signal A1 is active while other activation signals are inactive.

Taking another example of period N where data 2 turns from active to inactive whereas data 3 turns from inactive to active (data 1 and data 4 remain in inactive state), the output from latch 314 is active (because data 2 was active before the transition) while the input to latch 314 is inactive (because data 2 is inactive after the transition). Two inputs to XOR gate 354 correspond to the input and output of latch 314, respectively. The two inputs to XOR gate 354 have different values, and hence, the output from XOR gate 354 turns active. The output from latch 316 is inactive (because data 3 was inactive before the transition) but the input to latch 316 is active (because data 3 was active before the transition). Two inputs to XOR gate 356 correspond to the input and output of latch 316, respectively. The two inputs to XOR gate 356 have different values, and hence, the output from XOR gate 326 turns active. The outputs from XOR gates 324 and 326 are both active, and hence, activation signal A2 generated by AND gate 324 turns active. Data 1 and data 4 remain unchanged during period M, and hence, the outputs of XOR gates 352 and 358 remain inactive. Accordingly, the outputs of AND gates 324 is active while the outputs of AND gates 322, 326 and 328 remain inactive. Therefore, activation signal A2 is active while other activation signals are inactive.

FIG. 6 is a timing diagram illustrating the states of control signals C1 through C4, according to one embodiment. As illustrated in FIG. 6, the control signals C1 through C4 lag behind decoder outputs data 1 through data 4 by about a half clock cycle due to synchronization with the clock signal.

Since control signals C1 through C4 are synchronized and free from data dependent noise, the differential analog signal at outputs OUTP and OUTN (refer to FIG. 3A) of DAC 110 has better linearity compare to the differential analog signal generated without synchronizing the control signals.

Figure 7:
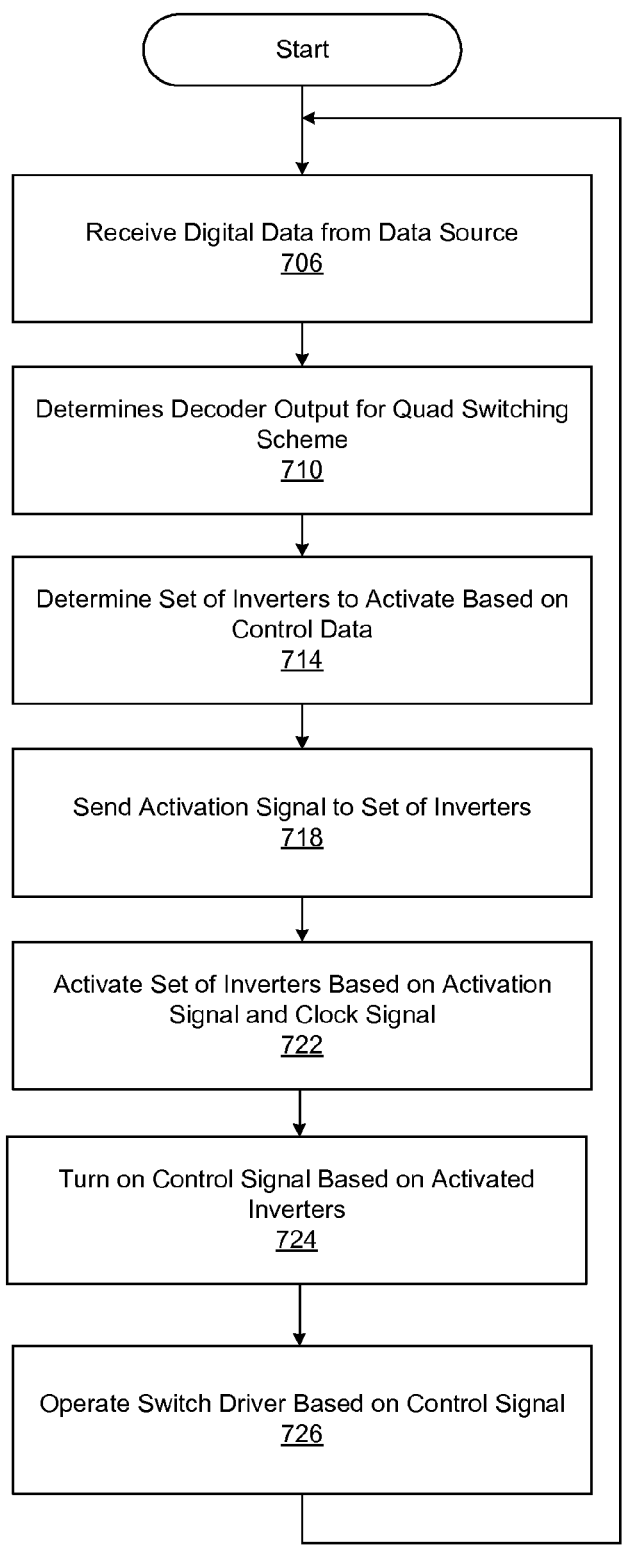
FIG. 7 is a flowchart illustrating a method of operating a DAC using a quad switching scheme, according to one embodiment.

FIG. 7 is a flowchart illustrating a method of operating DAC 110 using a quad switching scheme, according to one embodiment. First, decoder 140 receives 706 digital data 122 (binary data) from data source 120. Decoder 140 then determines 710 decoder outputs 124'A through 124'N to be sent to each switching module 150' connected to current source 144 for the quad switching scheme. Each decoder signal 124' includes four signal elements (data 1 through data 4).

Switching module 150' receives the decoder output data 1 through data 4 (collectively decoder signal 124') and determines 714 a set of inverters 342, 344, 346, 348 to activate based on the decoder output data. Predictor module 310 of switching module 150' sends 718 an activation signal to one set of inverters to cross-couple the inverters between two control lines.

Then the set of inverters is activated 722 based on the activation signal and clock signal. A control signal is activated 724 based on the activation of the set of inverters. The control signal operates 726 switch driver circuit 270'. Specifically, the control signal turns on one of switches SW1 through SW4 in switch driver circuit 270'. Then the process returns to receiving 706 digital data from data source, and repeats the subsequent processes.

In other embodiments, more than four switches are coupled between a current source and differential outputs. In such embodiments, a decoder may provide decoder outputs with more than four signal elements and the control signals may also have more than four signal elements.

In other embodiments, a decoder generates decoder signals 124A through 124N that merely indicates how the current source should be steered without each decoder signal having four signal elements to implement a quad switching scheme. Instead, switch driver circuit receives the decoder signal and generates internal signals for implementing a quad switching scheme.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A switching module in a digital-to-analog converter, comprising:
    a switch driver circuit comprising four switches between differential outputs and a current source, two of the four switches connecting the current source to a first one of the differential output when turned on, the remaining two of the four switches connecting the current source to a second one of the differential outputs when turned on;
    a synchronizing circuit coupled between a decoder and the switch driver circuit, the synchronizing circuit configured to:
        receive a first digital signal at a first clock cycle, the first digital signal indicating turning on of a first switch of four switches in the switch driver circuit and turning off of three switches other than the first switch;
        receive a digital signal at a second clock cycle subsequent to the first clock cycle, the second digital signal indicating turning on of a second switch of four switches in the switch driver and turning off of three switches other than the second switch; and
        generate, based on the first digital signal, a control signal having four signal elements and representing a synchronized version of the second digital signal having waveforms of the signal elements aligned by a clock signal, the control signal implementing a quad switching scheme for switching the four switches.

2. The switching module of claim 1, wherein the synchronizing circuit comprises a plurality of transistors turned on or off by the clock signal to align the signal elements of the control signal.

3. A switching module in a digital-to-analog converter, comprising:
    a switch driver circuit comprising a plurality of switches;
    a synchronizing circuit coupled to the switch driver circuit and configured to:
        receive a first digital signal at a first time, the first digital signal indicating turning on of a first switch of the plurality of switches in the switch driver circuit and turning off of the plurality of switches other than the first switch;
        receive a second digital signal at a second time subsequent to the first time, the second digital signal indicating turning on of a second switch of the plurality of the plurality of switches and turning off of the plurality of switches other than the second switch; and
        generate a control signal having a plurality of signal elements and representing a synchronized version of the second digital signal wherein waveforms of the signal elements are aligned by a clock signal.

4. The switching module of claim 3, wherein the switch driver circuit comprises four switches that are controlled by the control signal according to a quad switching scheme.

5. The switching module of claim 4, wherein two of the four switches connect a current source to a first one of two differential outputs when the two switches are turned on, and remaining two of the switches connect the current source to a second one of the two differential outputs when the remaining two switches are turned on.

6. The switching module of claim 3, wherein the synchronizing circuit comprises a plurality of transistors turned on or off by the clock signal to align the signal elements of the control signal.

7. The switching module of claim 6, wherein the synchronizing circuit further comprises:

a plurality sets of inverters, each set of inverters coupled between two control lines for transmitting part of the control signal; and a combination of sequential logic components and combinational logic components coupled to the plurality sets of inverters, the combination configured to send an activation signal for activating a set of inverters at a time.

8. The switching module of claim 7, wherein the combination comprises a plurality of latches configured to receive the first and second digital signals, a plurality of first gate components each having an input coupled to an input of a latch and another input coupled to an output of the latch to determine a change in a corresponding signal element between the first time and the second time, and a plurality of second gate components each having two inputs connected to outputs of the two of the first gate components, each of the second gate components configured to send an activation signal to a set of inverters.

9. The switching module of claim 7, wherein each set of inverters comprises a first inverter and a second inverter, wherein the first inverter when turned on has an input coupled to a first one of the two control lines and an output coupled to a second one of the two control lines, and wherein the second inverter when turned on has an input coupled to the second one of the two control lines and an output coupled to the first one of the two control lines.

10. The switching module of claim 3, wherein the switch driver circuit is coupled between a current source and two differential outputs to couple the current source to one of the two differential outputs based on the control signal.

11. The switching module of claim 3, wherein the decoder is configured to convert a binary digital data to the first and second digital signals that are thermometer coded.

12. A method of turning on or off switches in a digital-to-analog converter, comprising:

receiving a first digital signal at a first time from a data source, the first digital signal indicating turning on of a first switch of the plurality of switches in the switch driver circuit and turning off of the plurality of switches other than the first switch;

receiving a second digital signal at a second time subsequent to the first time, the second digital signal indicating turning on of a second switch of the plurality of switches in the switch driver circuit and turning off of the plurality of switches other than the second switch;

generating a control signal having a plurality of signal elements and representing a synchronized version of the second digital signal, wherein waveforms of the signal elements are aligned by a clock signal; and switching on or off the plurality of switches in the switch driver circuit based on the control signal.

13. The method of claim 12, further comprising controlling switching of the plurality of switches according to a quad switching scheme.

14. The method of claim 13, further comprising:

connecting a current source to a first one of two differential outputs when either of two of the plurality of switches is turned on; and connecting the current source to a second one of the two differential outputs when either of remaining two of the plurality of switches is turned on.

15. The method of claim 12, further comprising controlling turning on or off of a plurality of transistors by the clock signal to align the signal elements of the control signal.

16. The method of claim 15, wherein generating the control signal comprises:

generating an activation signal by a combination of sequential logic components and combinational logic components responsive to receiving the second digital signal; and turning on or off a set of inverters based on the activation signal, each set of inverters coupled between two control lines for transmitting part of the control signal.

17. The method of claim 16, wherein generating the activation signal comprises:

receiving the first and second digital signals at a plurality of latches;

determining a change in a signal element of the first digital signal and a corresponding signal element of the second digital signal by a first gate component having an input coupled to an input of a latch and another input coupled to an output of the latch; and sending an activation signal to the a set of inverters by a second gate component having inputs coupled to outputs of two first gate components, each first gate component associated with a corresponding signal element of the control signal.

18. The method of claim 16, further comprising:

turning on a first inverter of the set of inverters responsive to receiving the activation signal, wherein the first inverter has an input coupled to a first one of the two control lines and an output coupled to a second one of the two control lines; and turning on a second inverter of the set of inverters responsive to receiving the activation signal, wherein the second inverter has an input coupled to the second one of the two control lines and an output coupled to the first one of the two control lines.

19. The method of claim 12, further comprising coupling a current source to one of two differential outputs based on the control signal.

20. The method of claim 12, further comprising converting a binary digital data received from the data source into the first and second digital signals that are thermometer coded.

21. A digital-to-analog converter comprising:

a switch driver circuit comprising a plurality of switches for steering current to an output of the digital-to-analog converter;

a decoder configured to convert a first binary digital data received from a data source at a first time into a first digital signal and a second binary digital data received at a second time subsequent to the first time into a second digital signal, the first digital signal indicating turning on of a first switch of the plurality of switches in the switch driver circuit and turning off of the plurality of switches other than the first switch, the second digital signal indicating turning on of a second switch of the plurality of switches and turning off of the plurality of switches other than the second switch;

a synchronizing circuit between the switch driver circuit and the decoder, the synchronizing circuit configured to:

receive the first digital signal and the second digital signal; and generate a control signal having a plurality of signal elements and representing a synchronized version of the second digital signal wherein waveforms of the signal elements are aligned by a clock signal.

22. The digital-to-analog converter of claim 21, wherein the switch driver circuit comprises four switches that are controlled by the control signal according to a quad switching scheme.

* * * * *